(12) United States Patent　(10) Patent No.:　US 7,969,773 B2
　　Yang　　　　　　　　　　　　　　　(45) Date of Patent:　　Jun. 28, 2011

(54) COMPUTER SYSTEM WITH ADDRESSABLE STORAGE MEDIUM

(76) Inventor: Ching-Hsi Yang, Taipei (TW)

( * ) Notice: Subject to any disclaimer, the term of this patent is extended or adjusted under 35 U.S.C. 154(b) by 414 days.

(21) Appl. No.: 12/270,411

(22) Filed: Nov. 13, 2008

(65) Prior Publication Data

US 2009/0198941 A1　Aug. 6, 2009

(30) Foreign Application Priority Data

Feb. 5, 2008　(TW) ............................... 97104460 A (51) Int. Cl.
　　*G11C 11/14*　(2006.01)
(52) U.S. Cl. ............ 365/171; 365/189.011; 365/189.14; 360/123.01
(58) Field of Classification Search ............. 360/123.01, 360/123.02, 123.11; 365/171, 189.011, 189.14
See application file for complete search history.

(56) References Cited

U.S. PATENT DOCUMENTS

| | | | | |
|---|---|---|---|---|
| 4,972,287 A * | 11/1990 | Das | ........................ | 360/123.05 |
| 6,275,354 B1 * | 8/2001 | Huai et al. | ............... | 360/123.61 |
| 6,600,697 B2 * | 7/2003 | Tahira et al. | ................ | 369/13.17 |
| 6,650,496 B2 * | 11/2003 | Nozieres et al. | ................ | 360/63 |
| 7,016,253 B2 * | 3/2006 | Yang | ........................ | 365/230.01 |
| 7,130,152 B1 * | 10/2006 | Raymond et al. | ............. | 360/121 |
| 7,697,352 B2 * | 4/2010 | Yang | ........................ | 365/189.14 |
| 2008/0186625 A1 * | 8/2008 | Yang | ............................ | 360/110 |

* cited by examiner

*Primary Examiner* — Alexander Sofocleous
(74) *Attorney, Agent, or Firm* — WPAT, PC; Justin King (57) ABSTRACT

A computer system with an addressable medium is disclosed. The computer system comprises an addressable medium subsystem, a microprocessor and at least one input/output device. The addressable medium subsystem includes: a control logic which has a control circuit with an address table for storing a plurality of addresses, and an access logic with a storage medium layer and an electromagnetic induction circuit. The electromagnetic induction circuit includes a plurality of coils and a plurality of rods. Each rod is surrounded by one of the coils and corresponds to one of a plurality of regions on the storage medium layer. The access logic controls the coils to access the data stored on the regions for the control logic. Each region corresponds to one of the addresses on the address table. The microprocessor and the input/output device electrically couple with the control logic. Both the microprocessor accesses instructions for executing and the input/output device accesses data via the control logic.

25 Claims, 9 Drawing Sheets

COMPUTER SYSTEM WITH ADDRESSABLE STORAGE MEDIUM

FIELD OF THE INVENTION

The present invention relates to computer architectures, more particularly to computer systems with addressable digital data storage media.

BACKGROUND OF THE INVENTION

1. Description of the Prior Art

The basic structure of a PC (Personal Computer) can be generally divided into three sections: a central processing unit (CPU), a chipset and peripherals. The chipset is usually consisted of North Bridge and South Bridge. North Bridge is used for communicating and managing between the CPU, a display and a memory (RAM). South Bridge manages the connection of peripherals, such as storage devices (floppy disk, hard disk, CD-ROM or recorder etc.), network functionality, as well as providing a PCI interface for peripheral expansion. Connection to the display is handled by North Bridge, but apart from that, almost the rest of input/output (I/O) devices of the peripherals, such as a printer, a network device, a speaker or a multimedia player, are handled by South Bridge. The communication between the CPU and South Bridge is done through North Bridge.

The storage system hierarchy under the current computer architectures is called the memory hierarchy. Each hierarchy is faster, smaller in storage capacity and lower in delay compared with the hierarchy immediately below it. Most up-to-date CPUs are very fast, while most programs require access to memories. A cache and a memory are at different levels of the memory hierarchy, accessing a memory will take a long time. The ranking of access speed of the memory hierarchy in most computers, from fast to slow, are as follows: registers, a L1 cache, a L2 cache, a main memory (DRAM) and hard disks. When the CPU needs data, it will make a request to the main memory, which then returns the requested data back to the CPU. However, if the main memory does not have the requested data, it asks the hard disk, which then returns the data back to the main memory. North and South Bridges are responsible for coordinating these processes. Hard disks usually have the largest storage capacity, but the slowest. Thus, the current computer architectures are limited in terms of speed. In addition, in traditional hard disk devices, the read/write (R/W) heads and the disks are easily damaged, resulting in data lost.

SUMMARY OF THE INVENTION

In view of the prior art and the needs of the related industries, the present invention provides a computer system with an addressable digital data access device to solve the drawbacks of prior-art computer systems.

Accordingly, one objective of the present invention is to provide an addressable digital data access computer system, which includes the addressable digital data access subsystem 300, a microprocessor 400, and at least one I/O device 500. The aforementioned addressable digital data access subsystem 300 includes: a control module 310 having a control subcircuit 340 that has at least one access address table 340A for storing a plurality of access addresses; and an access module 320 having at least one storage medium layer 260 and an electromagnetic induction subcircuit 370, which has a plurality of coils and magnetizable rods. Each rod is partially wound by a coil and corresponds to one of a plurality of regions in the storage medium layer 360. The control module controls the plurality of coils through the access module according to the access address table, in order to access the digital data stored in the plurality of regions, wherein each region corresponds to one of a plurality of access addresses in the access address table 340A.

In addition, the microprocessor 400 is electrically coupled with the control module 310. The microprocessor 400 is able to access instructions to be executed by it in the storage medium layer 360 through the control module 310. In addition, the I/O device 500 is electrically coupled with the control module 310. The I/O device 500 is able to access digital data in the storage medium layer 360 through the control module 310. In particular, the microprocessor 400 and the I/O device 500 can be electrically coupled to the control module 310 via a transmission interface 350 of the control module 310.

BRIEF DESCRIPTION OF THE DRAWINGS

The accompanying drawings incorporated in and forming a part of the specification illustrate several aspects of the present invention, and together with the description serve to explain the principles of the disclosure. In the drawings.

DETAILED DESCRIPTION OF THE PREFERRED EMBODIMENTS

The present invention provides a computer system with addressable storage medium by adopting an addressable digital data access subsystem as the storage medium in lieu of traditional memories and hard disks, allowing various integrated circuits (e.g. a CPU, North and South Bridge, display chip etc.) in the computer system and peripherals to storage digital data.

Figure 1:
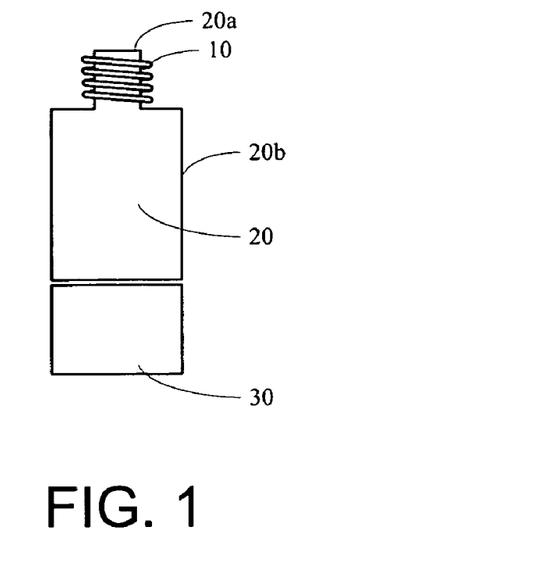
FIG. 1 is a schematic diagram illustrating a R/W head of the present invention.

Referring to FIG. 1, the addressable digital data access subsystem of the present invention uses a read/write (R/W) head, which includes a coil 10 and a rod 20. The rod 20 can be magnetized and may be in the shape of a vase, a column or some other shapes, and the present invention is not limited to these. The rod 20 can have a neck 20a and a body 20b. The coil 10 is wound around the neck 20a of the rod.

In a write process, the coil 10 is energized by passing current through the coil 10, thus forming a magnetic field around the rod 20. This magnetic field magnetizes a submicron region 30 near the body 20b of the rod 20.

In a read process, the rod 20 is magnetized by the magnetized submicron region 30. As a result, a current is generated in the coil 10.

The above submicron regions may be provided by a storage medium layer, which can be a plurality of magnetic materials arranged in an array, or a plurality of regions arranged in an array on a magnetic film. In a preferred embodiment of the present invention, the storage medium layer is a magnetic film. The above implementation of the storage medium layer is for illustration purpose only, and is not to limit the present invention in any way. Other implementations of the storage medium layer may be easily conceived by one skilled in the art.

Figure 2A:
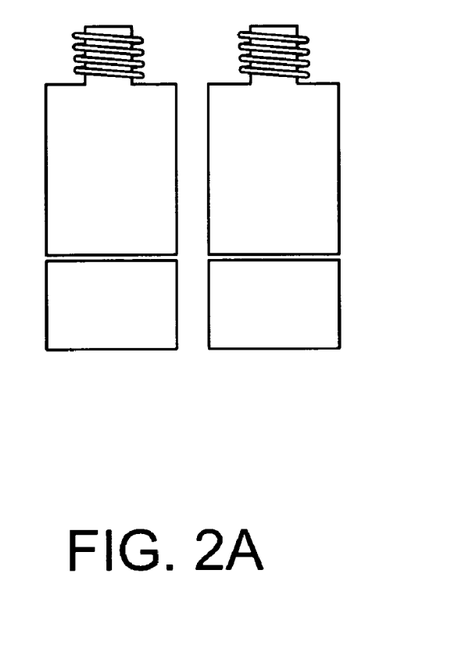
FIG. 2A is a schematic diagram illustrating the arrangement of the R/W heads.
Figure 2B:
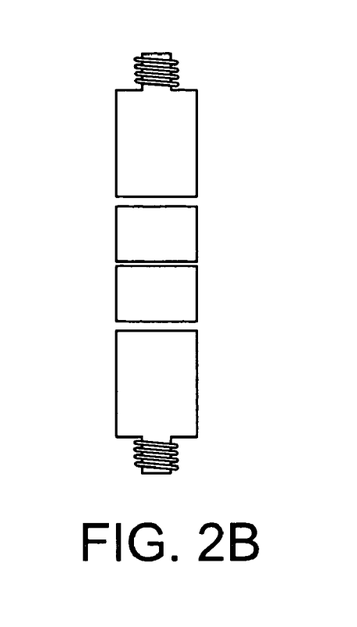
FIG. 2B is a schematic diagram illustrating another arrangement of the R/W heads.
Figure 2C:
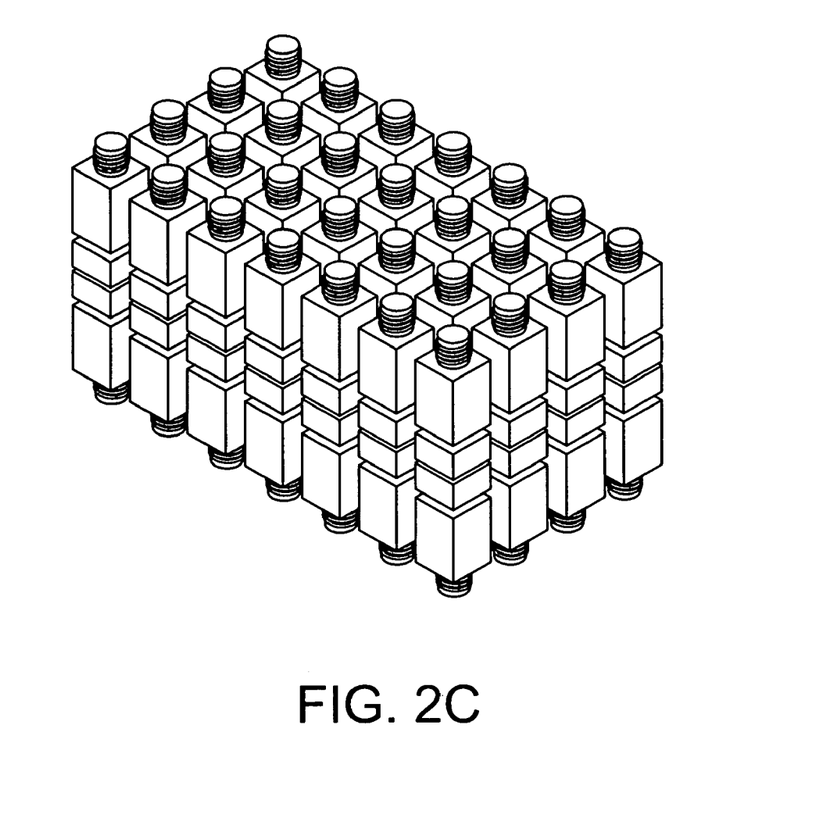
FIG. 2C is a schematic diagram illustrating the overall arrangement of the R/W heads.

Referring to FIG. 2A, the R/W heads are arranged side by side in parallel, forming an array. Alternatively, the R/W heads may also be arranged one on top of another as shown in FIG. 2B, wherein the magnetizable regions of the upper and lower layers are adjacent to each other. The magnetizable regions of the upper and lower layers can be provided with two layers of magnetic materials or a single layer of magnetic material with upper and lower surfaces. A plurality of R/W heads can further be arranged in a matrix as shown in FIG. 2C.

Accordingly, in the addressable digital data access subsystem, the rod 20 and the coil 10 of FIG. 1 may constitute a electromagnetic induction subcircuit, and all of the magnetizable regions may be constituted by at least one storage medium layer. The at least one storage medium layer and a magnetic induction subcircuit forms an access module of the addressable digital data access subsystem The addressable digital data access subsystem may further include a control module having a control subcircuit. The control subcircuit contains an access address table for storing a plurality of access addresses.

In a preferred embodiment of the present invention, the addressable digital data access subsystem includes: a control module having a control subcircuit, wherein the control subcircuit contains an access address table for storing a plurality of access addresses; a access module having at least one storage medium layer and an electromagnetic induction subcircuit, wherein the electromagnetic induction subcircuit includes a plurality of coils and a plurality of magnetizable rods, each rod being partially wound by a coil and corresponding to one of a plurality of regions of the storage medium layer. The control module controls the plurality of coils through the access module according to the access address table, in order to access the digital data stored in the plurality of regions, wherein each region corresponds to one of a plurality of access addresses in the access address table.

Figure 3:
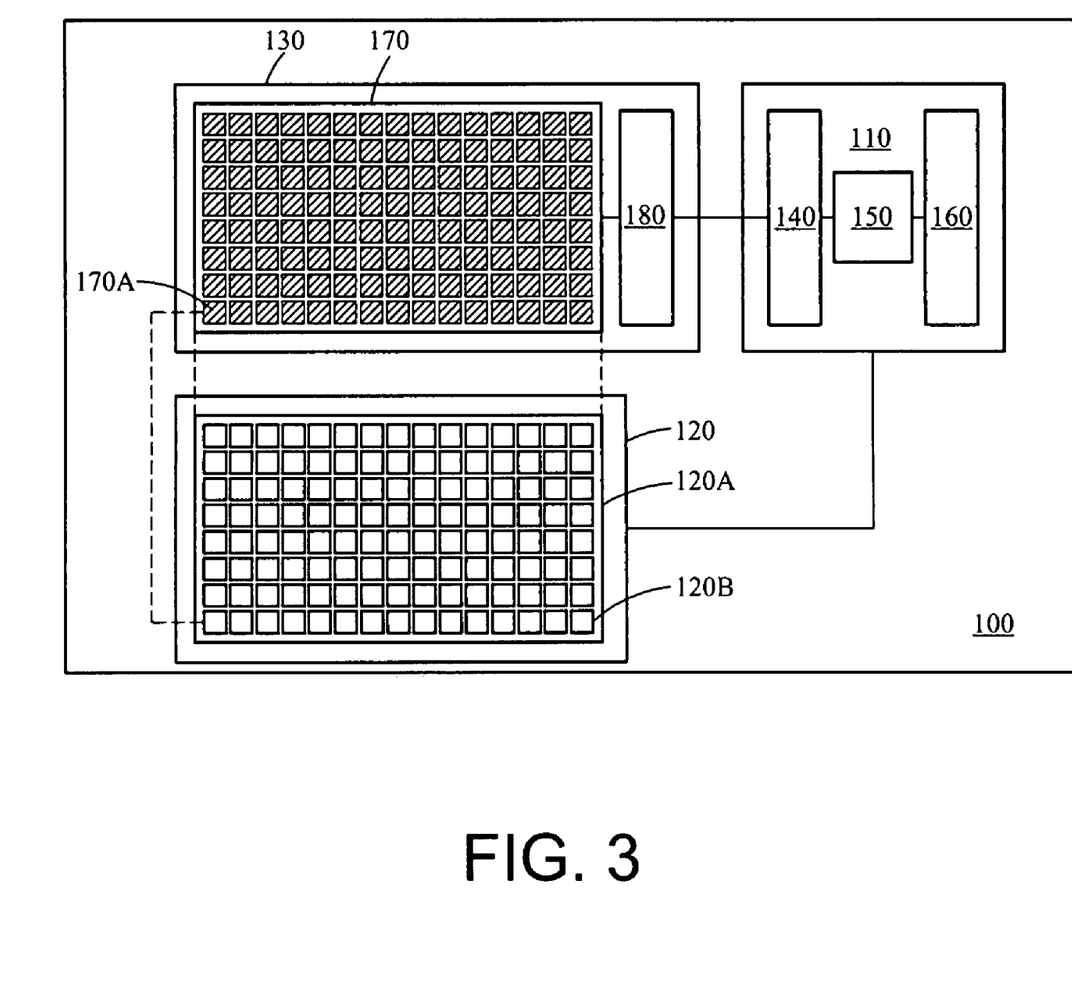
FIG. 3 is a block diagram depicting an addressable digital data access subsystem according to one embodiment of the present invention.

Referring to FIG. 3, the present invention provides an addressable digital data access subsystem 100, which includes a control module 110, a storage module 120 and an access module 130. The control module 110 and the access module 130 are electrically coupled with each other, so that the access module 130 is controlled by the control module 110. The storage module 120 is swappable so that it can be swapped with another storage module as needed. The control module 110 further includes a connection interface 140, a control subcircuit 150, and at least one transmission interface 160. The control subcircuit 150 is electrically coupled to the connection interface 140 and the at least one transmission interface 160, respectively. The addressable digital data access subsystem 100 communicates with electronic devices outside the system via the transmission interface 160. The access module 130 further includes an electromagnetic induction subcircuit 180 and an electromagnetic induction region 170 having a plurality of micro-R/W elements 170A.

The micro-R/W heads 170A can be the coils and magnetizable rods mentioned above. The electromagnetic induction region 170 is electrically coupled with the electromagnetic induction subcircuit 180. Each micro-R/W head 170A is formed in the electromagnetic induction region 170 according to a given access address.

Referring to FIG. 3, the storage module 120 further includes at least one electromagnetic induction medium 120A, which corresponds to the location of the electromagnetic induction region 170 of the access module 130. The at least one electromagnetic induction medium 120A includes a plurality of digital data access regions 120B, each of which is provided in the at least one electromagnetic induction medium 120A according to a given access address, so as to correspond to the location of a micro-R/W head 170A. Accordingly, each micro R/W element 170A may electromagnetically access a corresponding digital data access region 120B on the same access address.

Furthermore, when the storage module 120 is disposed in the addressable digital data access subsystem 100, the storage module 120 may also receive power transmitted by the addressable digital data access subsystem 100, reducing the required power of the access module 130. The storage module 120 is electrically coupled with the control module 110, so that the control subcircuit 150 can control both the micro-R/W head 170A and the digital data access region 120B on a given access address. On the other hand, the at least one electromagnetic induction medium 120A may further include an electrically conductive material to enhance the effect of electromagnetic induction. The operations of the addressable digital data access subsystem 100 are as follow: first, the storage module 120 is disposed in a particular location of the addressable digital data access subsystem 100.

When an external electronic device outside the system wishes to access digital data on a particular access address, it transmits an access signal to the control module 110 through the transmission interface 160 in order to access digital data on that particular access address. Then, the control subcircuit 150 of the control module 110 transmits a control signal to the electromagnetic induction subcircuit 180 through the connection interface 140 for controlling the micro-R/W head 170A to interact with the electromagnetic induction medium 120A of the storage module 120 on the same access address by electromagnetic induction, such that digital data stored in the digital data access region 120B corresponding to the particular access address can be accessed. The digital data access region 120B may be a submicron first region and second region described in the second embodiment.

Figure 4:
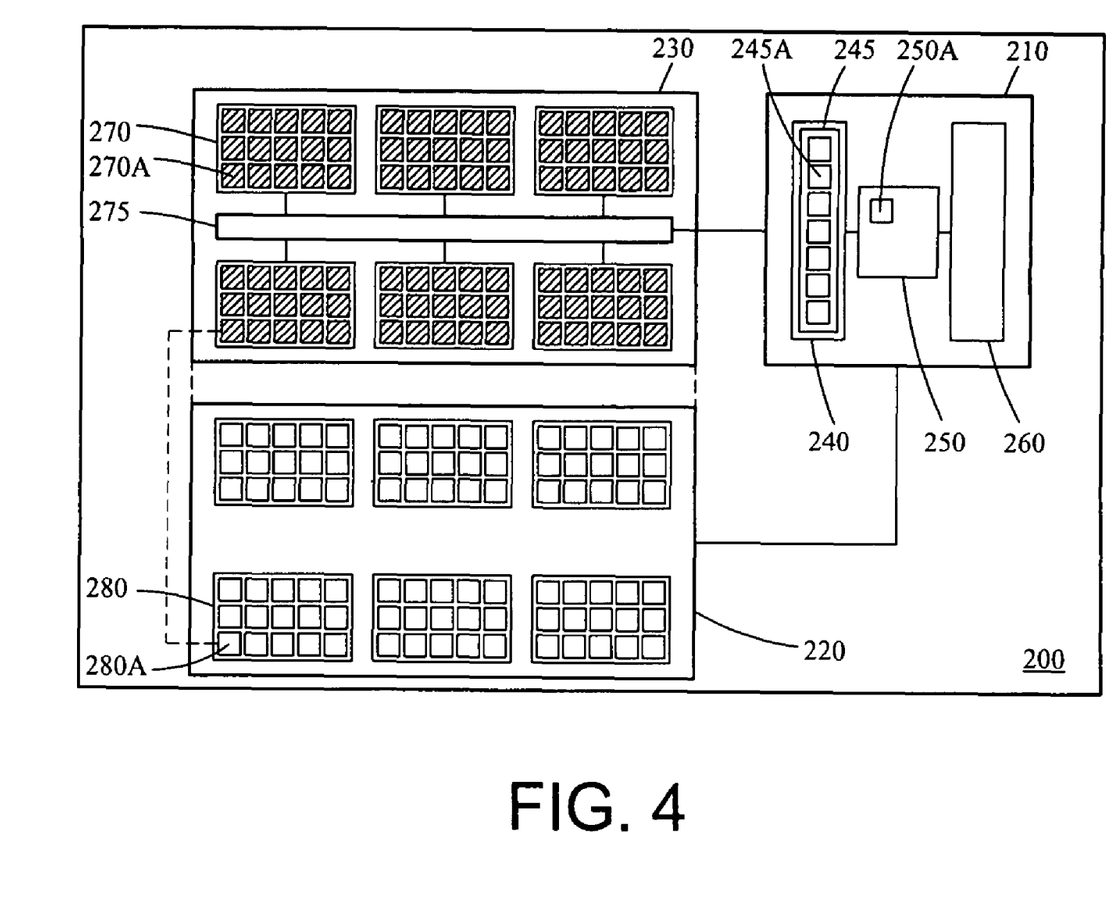
FIG. 4 is a block diagram depicting an addressable digital data access subsystem according to another embodiment of the present invention.

Referring to FIG. 4, the present invention provides an addressable digital data access subsystem 200, which includes a control module 210, a storage module 220 and an access module 230. The control module 210 and the access module 230 are electrically coupled with each other, so that the access module 230 is controlled by the control module 210. The storage module 220 is swappable so that it can be swapped with another storage module as needed. The control module 210 further includes a connection interface 240, a control subcircuit 250, and at least one transmission interface 260. The control subcircuit 250 is electrically coupled to the connection interface 240 and the at least one transmission interface 260, respectively. The addressable digital data access subsystem 200 communicates with electronic devices outside the system via the transmission interface 260. In addition, the control subcircuit 250 has at least one access address table 250A for storing a plurality of access addresses. The connection interface 240 has a switch subcircuit 245 for actuating a plurality of electromagnetic induction regions 270. The switch subcircuit 245 includes a plurality of access address switches 245A, each of which corresponds to an access address in the access address table 250A. Thus, based on the access address table 250A, the control subcircuit 250 can control the access address switches 245A of the switch subcircuit 245. The access module 230 further includes an electromagnetic induction subcircuit 275 having the plurality of electromagnetic induction regions 270, and in each region 270, a micro-R/W element 170A is provided according to each access address in the access address table 250A. The micro R/W elements 270A are respectively electrically coupled with the access address switches 245A of the switch subcircuit 245 through the electromagnetic induction subcircuit 275.

Referring to FIG. 4, the storage module 220 further includes a plurality of electromagnetic induction media 280, each of which corresponds to the location of an electromagnetic induction region 270 of the access module 230, and interacts therewith by electromagnetic induction. Each electromagnetic induction medium 280 includes a plurality of digital data access regions 280A, each of which is provided in the electromagnetic induction media 280 according to an access address in the access address table 250A, so as to correspond to the location of a micro-R/W head 270A in the electromagnetic induction regions 270. Furthermore, when the storage module 220 is disposed in the addressable digital data access subsystem 200, the storage module 220 may also receive power transmitted by the addressable digital data access subsystem 200, reducing the required power of the access module 230. The storage module 220 can be electrically coupled with the control module 210, so that the control subcircuit 250 can control both the micro-R/W head 270A and the digital data access region 280A on the same access address. On the other hand, each electromagnetic induction medium 280 may further include an electrically conductive material to enhance the effect of electromagnetic induction.

The operations of the addressable digital data access subsystem 200 are as follow: first, the storage module 220 is disposed in a particular location of the addressable digital data access subsystem 200. When an external electronic device outside the system wishes to access digital data on a particular access address, it transmits an access signal to the control module 210 through the transmission interface 260, in order to access digital data on that particular access address. Then, the control subcircuit 150 of the control module 110 transmits a control signal to the switch subcircuit 245 of the connection interface 240, in order to turn on the access address switch 245A for the particular access address. Thereafter, the access address switch 245A transmits the control signal to the electromagnetic induction subcircuit 275 in the access module 230 for controlling the micro-R/W head 270A in the electromagnetic induction region 270, so as to interact with the electromagnetic induction medium 280 of the storage module 220 on the particular access address through electromagnetic induction, such that digital data stored in the digital data access region 280A corresponding to the particular access address can be accessed. The digital data access region 280A may be a submicron region described above.

Figure 5:
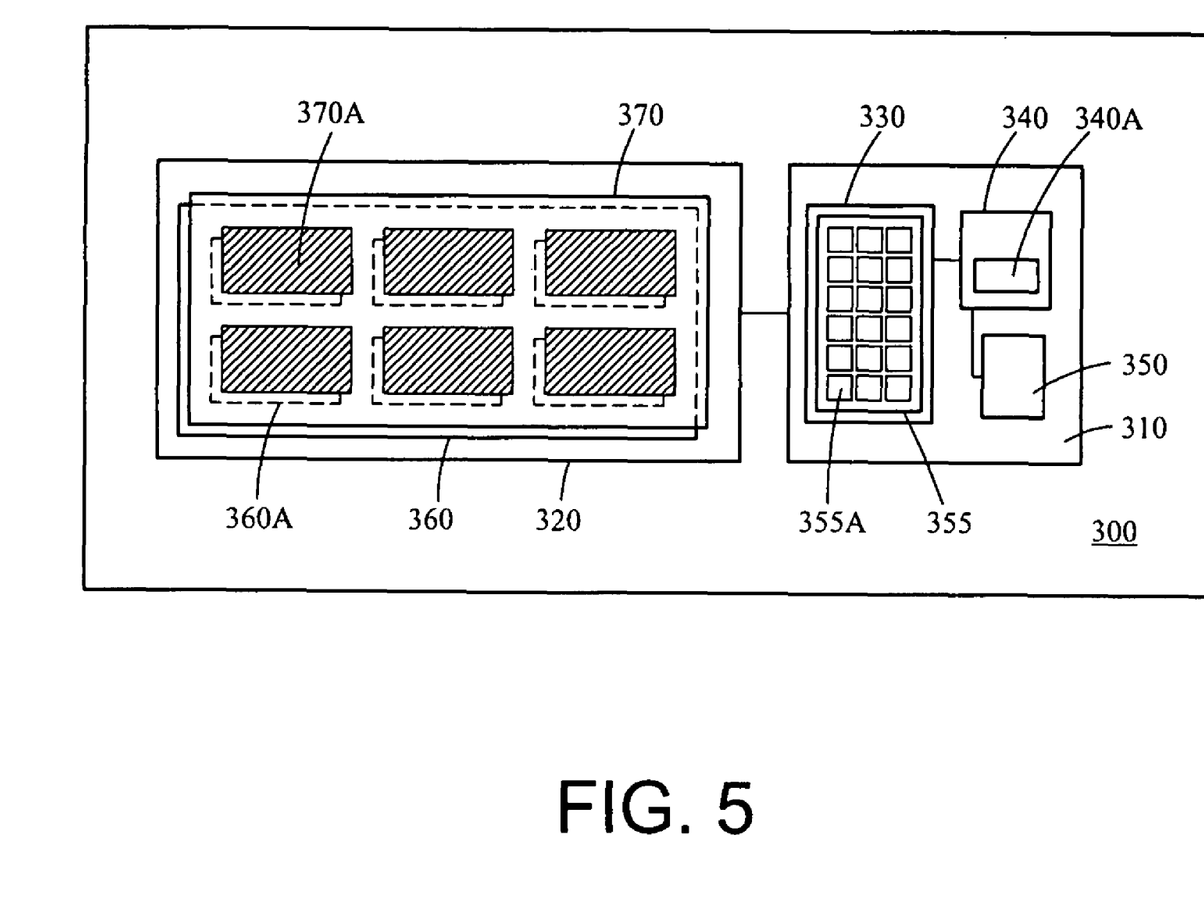
FIG. 5 is a block diagram depicting an addressable digital data access subsystem according to yet another embodiment of the present invention.

Referring to FIG. 5, the present invention provides an addressable digital data access subsystem 300, which includes a control module 310 and an access module 320. The control module 310 and the access module 320 are electrically coupled with each other, so that the access module 320 is controlled by the control module 310. The access module 320 is swappable so that it can be swapped with another storage module as needed. The control module 310 further includes a connection interface 330, a control subcircuit 340, and at least one transmission interface 350. The control subcircuit 330 is electrically coupled to the connection interface 330 and the at least one transmission interface 350, respectively. The addressable digital data access subsystem 300 communicates with electronic devices outside the system via the transmission interface 350. In addition, the control subcircuit 340 has at least one access address table 340A for storing a plurality of access addresses. The connection interface 330 has a switch subcircuit 355 for actuating a plurality of electromagnetic induction loops 370A.

Each electromagnetic induction loop 370A can be a R/W head described in the first embodiment of the present invention. The switch subcircuit 355 includes a plurality of access address switches 355A, each of which corresponds to an access address in the access address table 340A. Thus, based on the plurality of access addresses in the access address table 340A, the control subcircuit 340 can control the access address switches 355A of the switch subcircuit 355. The access module 320 includes at least one storage medium layer 360 and an electromagnetic induction subcircuit 370 having the plurality of electromagnetic induction loops 370A, wherein at least one storage medium layer 360 is formed on the plurality of electromagnetic induction loops 370A of the electromagnetic induction subcircuit 370, and the electromagnetic induction subcircuit 370 is electrically coupled with the switch subcircuit 355, so that each access address switch 355A can be electrically coupled to one electromagnetic induction loops 370A based on an access address in the access address table 340A.

Referring to FIG. 5, in this embodiment, the at least one storage medium layer 360 may further include a plurality of digital data access regions 360A, which are formed on the plurality of electromagnetic induction loops 370A based on an access address in the access address table 340A, so that access by direct electromagnetic induction can take place.

Each electromagnetic induction loop 370A can be a R/W head described in the first embodiment of the present invention. The control subcircuit 340 can control both the electromagnetic induction loop 370A and the digital data access region 360A on the same access address. The at least one storage medium layer 360 may further include an electrically conductive material to enhance the effect of electromagnetic induction. The operations of the addressable digital data access subsystem 300 are as follow: first, the access module 320 is disposed in a particular location of the addressable digital data access subsystem 300.

When an external electronic device outside the system wishes to access digital data on a particular access address, it transmits an access signal to the control module 310 through the at least one transmission interface 350, in order to access digital data on that particular access address. Then, based on the access address table 340A, the control subcircuit 340 of the control module 310 transmits a control signal to the switch subcircuit 355 of the connection interface 330, in order to turn on the access address switch 355A for that particular access address. Thereafter, the access address switch 355A transmits the control signal to the electromagnetic induction subcircuit 370 in the access module 320 for controlling the electromagnetic induction loop 270 so as to interact with the digital data access region 360A of the at least one storage layer 360 on the particular access address through electromagnetic induction, such that digital data stored in the digital data access region 360A corresponding to the particular access address can be accessed.

As mentioned before, in the embodiments of the present invention, the addressable digital data access subsystem enables electrically coupling between a control module having a control subcircuit with an access module having at least one storage medium layer and an electromagnetic induction subcircuit, so that the control module may control the access module. The electromagnetic induction subcircuit includes a plurality of coils and a plurality of magnetizable rods, each rod being partially wound by a coil. The coil can be energized and a magnetic field is formed through the rod. This magnetic field then magnetizes a submicron region close to the body of the rod. The magnetized submicron region then magnetizes the rod, and a current is generated in the coil corresponding to a particular access address. This can replace the access mechanism of traditional hard-disk system. Of course, the present invention can not only be used on electromagnetic digital data access subsystem, but can be applied to any kind of digital data access subsystems. Furthermore, the approach of providing micro-access element or inductive loop in the addressable digital data access subsystem through some particular addresses to replace the read/write mechanism of traditional electromagnetic hard disks is novel in the field of digital data access subsystem.

Figure 6:
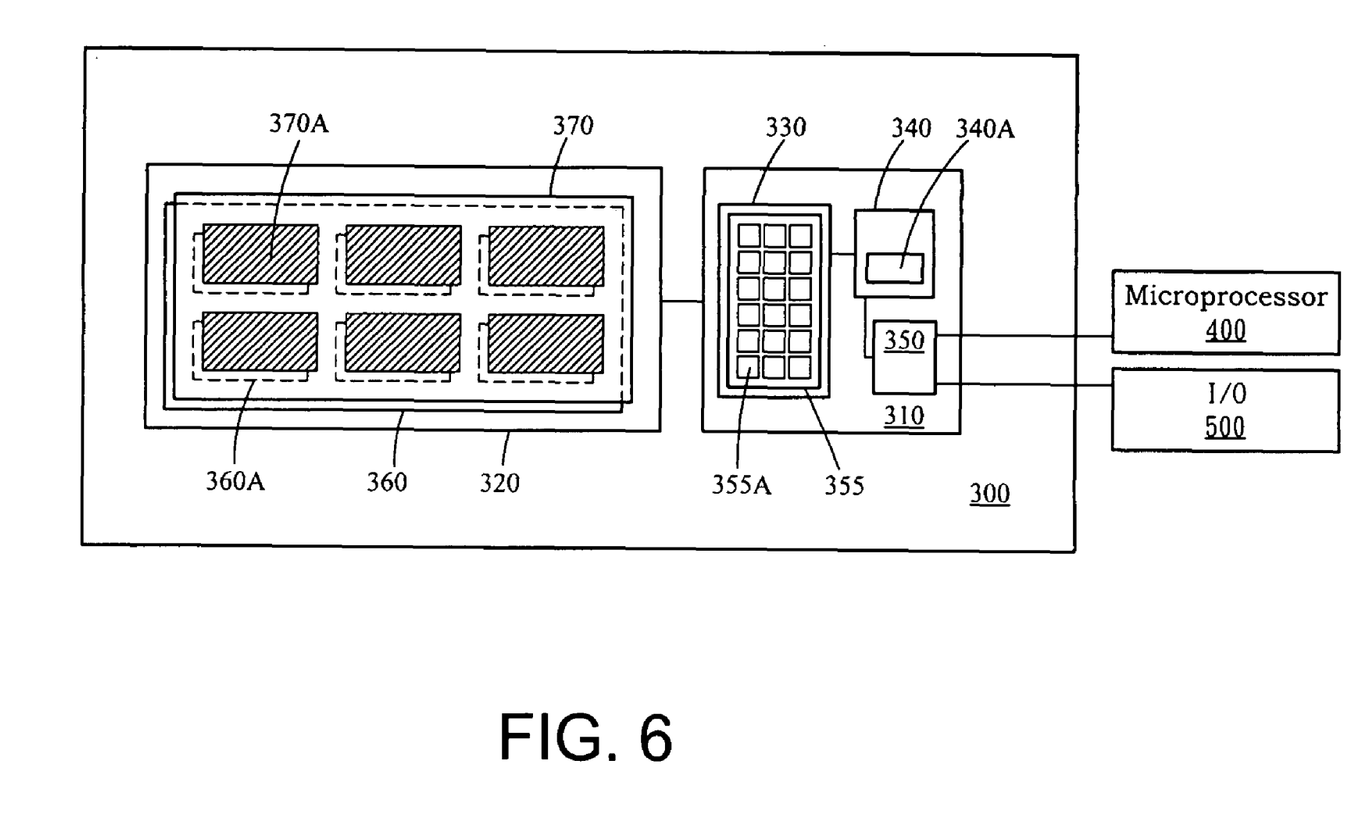
FIG. 6 is a block diagram depicting an addressable digital data access system according to an embodiment of the present invention.

Referring to FIG. 6, an embodiment of the present invention is an addressable digital data access computer system, which includes the addressable digital data access subsystem 300, a microprocessor 400, and at least one I/O device 500. The aforementioned addressable digital data access subsystem 300 includes: a control module 310 having a control subcircuit 340 that has at least one access address table 340A for storing a plurality of access addresses; and an access module 320 having at least one storage medium layer 260 and an electromagnetic induction subcircuit 370, which has a plurality of coils and magnetizable rods. Each rod is partially wound by a coil and corresponds to one of a plurality of regions in the storage medium layer 360. The control module controls the plurality of coils through the access module according to the access address table, in order to access the digital data stored in the plurality of regions, wherein each region corresponds to one of a plurality of access addresses in the access address table 340A.

In addition, the microprocessor 400 is electrically coupled with the control module 310. The microprocessor 400 is able to access instructions to be executed by it in the storage medium layer 360 through the control module 310. In addition, the I/O device 500 is electrically coupled with the control module 310. The I/O device 500 is able to access digital data in the storage medium layer 360 through the control module 310. In particular, the microprocessor 400 and the I/O device 500 can be electrically coupled to the control module 310 via a transmission interface 350 of the control module 310.

Figure 7:
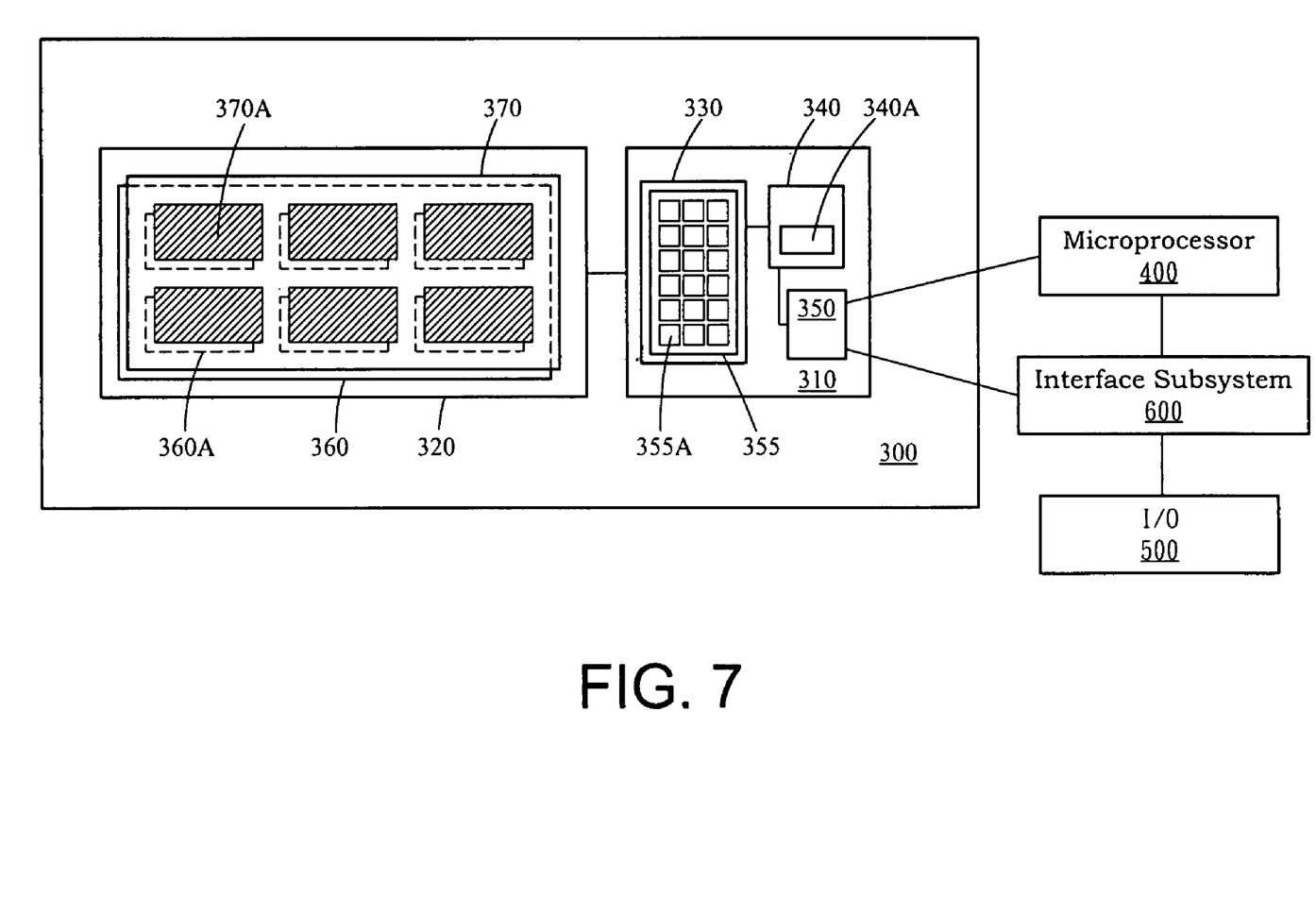
FIG. 7 is a block diagram depicting an addressable digital data access system according to another embodiment of the present invention.

Referring to FIG. 7, an embodiment of the present invention is an addressable digital data access computer system, which differs from that shown in FIG. 6 in that this system further includes an interface subsystem 600. The I/O device 500 is electrically coupled with the interface subsystem 600, so as to access digital data via this interface subsystem 600. The interface subsystem 600 is electrically coupled with the addressable digital data access subsystem 300, and it accesses digital data from the storage medium layer 360 via the control module 310.

Figure 8:
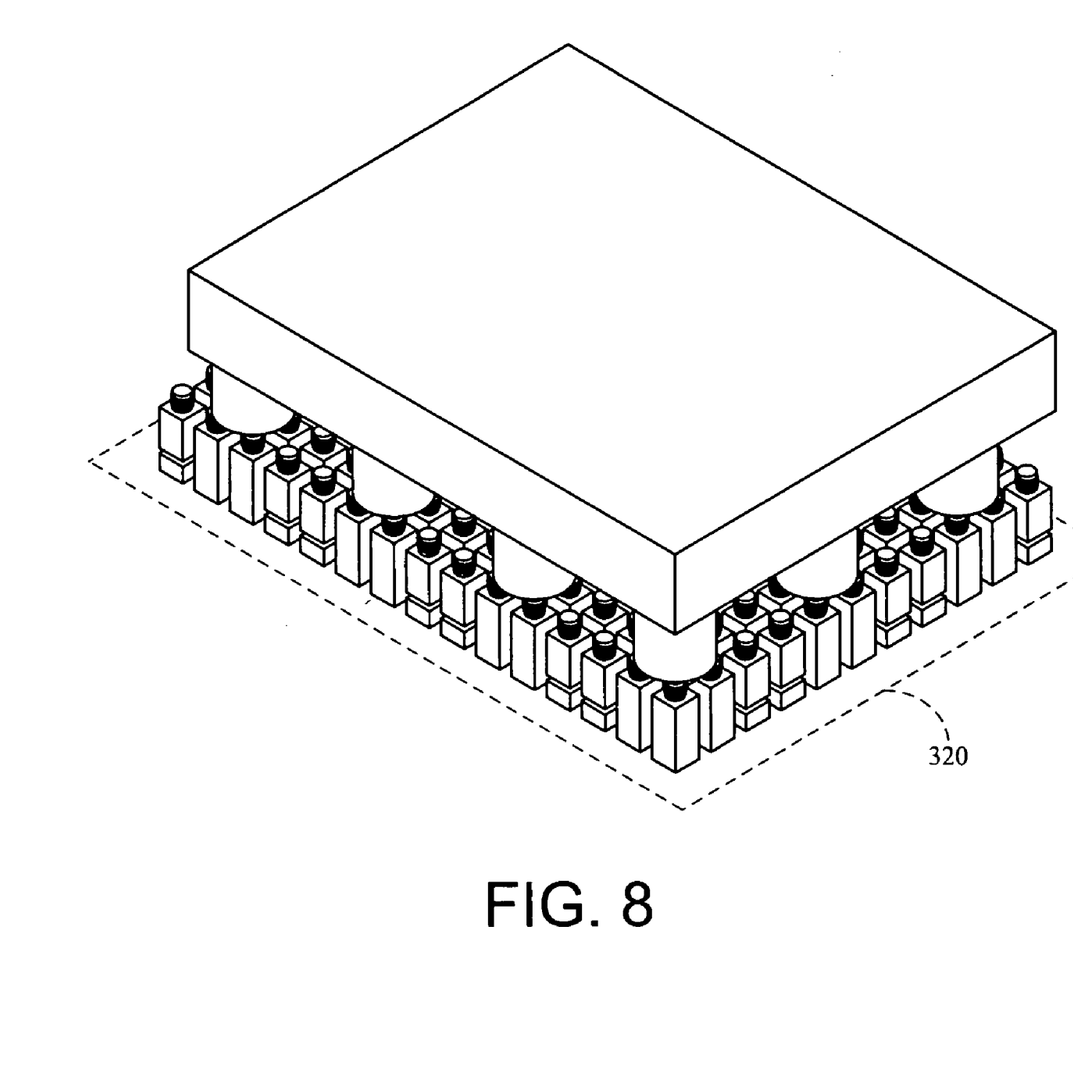
FIG. 8 is a schematic diagram illustrating an arrangement of an integrated circuit and a storage module.

Moreover, the addressable digital data access computer system of the present invention may further include North Bridge electrically coupled with the control module 310, so as to access digital data from the storage medium layer 360 via the control module 310. It is obvious to one skilled in the art that other circuits requiring access to storage medium layer can be coupled with the control module 310 in order to access digital data from the storage medium layer 360 via the control module 310. In addition, in one example of the present invention, integrated circuits (chips) can be provided on the access module 320, wherein some of the rods can be used as extension for the pins of the integrated circuits. As shown in FIG. 8, for example, the microprocessor and North Bridge can be provided on the access module 320, where each pin of the microprocessor and North Bridge is individually electrically coupled to the interface subsystem 600 through at least one rod. In other words, the rods in the access module 320 may include first rods for electromagnetic induction subcircuit and second rods for pin extensions that, for example, electrically coupled with the interface subsystem 600 via a pin module. In an example of the present invention, an integrated circuit may adopt a pin module as its pin extensions for electrically coupling with the transmission interface 350 mentioned above.

Figure 9:
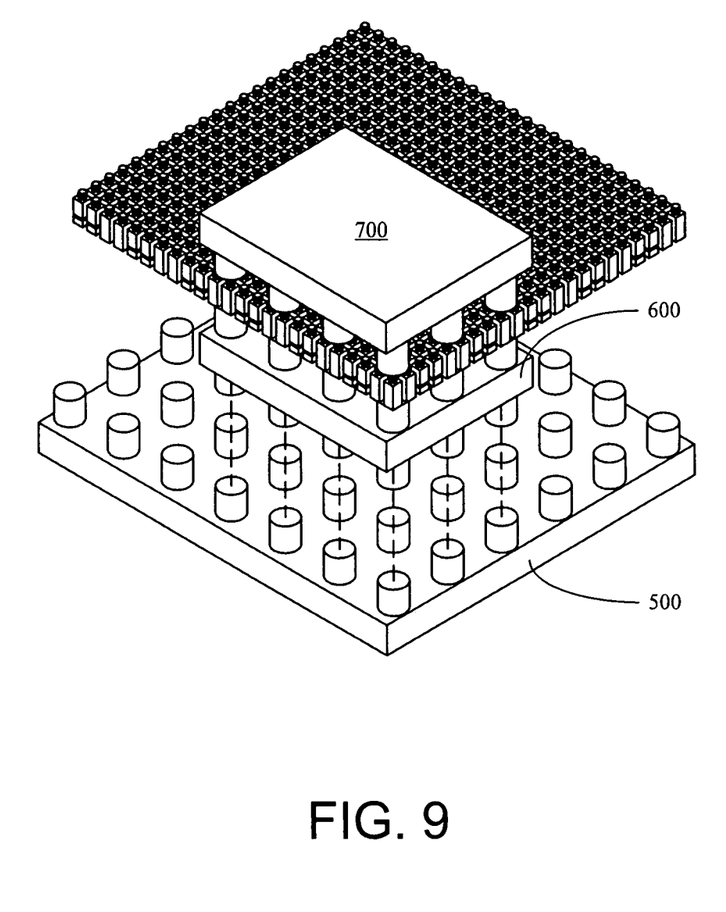
FIG. 9 is a schematic diagram illustrating an arrangement of an integrated circuit, a storage module, an interface subsystem and an I/O device.

It is obvious to one skilled in the art that the microprocessor 400 and the control module 310 can be integrated into a single integrated circuit 700 as shown in FIG. 9, and electrically coupled to the transmission interface 350 or the I/O device 500 via a pin module for its pin extensions. Alternatively, the microprocessor 400, the interface subsystem 600 and the control module 310 can be integrated into a single integrated circuit 700, or the microprocessor 400, North Bridge, the interface subsystem 600 and the control module 310 can be integrated into a single integrated circuit 700. Other schemes of integration may be recognized by one skilled in the art, and they are not to limit the present invention in any way For example, in an example of the present invention, the pins of the microprocessor 400 are electrically coupled with the pin module, using it as its pin extensions to electrically couple to the interface subsystem 600, which in turn electrically coupled to the mainboard and other peripherals (I/O devices 500), thus forming a complete computer system. FIG. 9 only shows the relevant parts of pins for I/O device 500, its implementation is well known in the art and not to limit the present invention in any way.

As another example, the microprocessor 400 includes the transmission interface 350 shown in FIG. 7. The integrated circuit can be an ASIC (application specific integrated circuit) that uses the pin module as its pin extensions to electrically couple to the interface subsystem 600, which in turn electrically coupled to the mainboard and other peripherals (I/O devices 500), thus forming a complete computer system.

In other words, the microprocessor 400 and the addressable digital data access subsystem 300 may be integrated into a single control system that uses the pin module for its external connection. Alternatively, the microprocessor 400, the addressable digital data access subsystem 300, and the interface subsystem 600 may be integrated into a single control system, in which the pin module electrically coupled with the interface subsystem 600, allowing the interface subsystem 600 to become the port for external connection, e.g. a socket or contact. As a result, the above control system may be an independent electronic element that can be connected with other peripherals, such as a CD player, a monitor, a speaker, a microphone, a printer, a keyboard, a mouse, a button etc., forming various electronic products like a computer, MP3 player, a thumb drive, a multimedia player etc. In other words, the above addressable digital data access subsystem 300 may supersede the memory, I/O port, caches (e.g. a L2 cache) or the like in a conventional computer. For example, the data transmitted between the microprocessor 400 and the I/O device 500 can be written to an I/O port simulated or implemented by the above addressable digital data access subsystem 300 through the interface subsystem 600, thereby achieving an interrupt mechanism as in the traditional computer system. In addition, the data transmitted between the microprocessor 400 and the I/O device 500 can be written to a memory simulated or implemented by the above addressable digital data access subsystem 300 through the interface subsystem 600, thereby achieving a memory access or DMA (direct memory access) mechanism as in the traditional computer system.

The foregoing description is not intended to be exhaustive or to limit the invention to the precise forms disclosed. Obvious modifications or variations are possible in light of the above teachings. In this regard, the embodiment or embodiments discussed were chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the inventions as determined by the appended claims when interpreted in accordance with the breath to which they are fairly and legally entitled.

It is understood that several modifications, changes, and substitutions are intended in the foregoing disclosure and in some instances some features of the invention will be employed without a corresponding use of other features. Accordingly, it is appropriate that the appended claims be construed broadly and in a manner consistent with the scope of the invention.

The invention claimed is:

1. An addressable digital data access computer system, comprising:
    an addressable digital data access subsystem, comprising
        a control module including at least one control subcircuit, wherein the control subcircuit has at least one access address table for storing a plurality of access addresses; and
        an access module including at least one storage medium layer and an electromagnetic induction subcircuit, wherein the electromagnetic induction subcircuit has a plurality of coils and a plurality of magnetizable rods, each rod being partially wound by a coil and corresponding to one of a plurality of regions in the storage medium layer, the control module controlling the plurality of coils through the access module according to the access address table, in order to access digital data stored in the plurality of regions, wherein each region corresponds to one of the plurality of access addresses in the access address table;
    a microprocessor electrically coupled with the control module, the microprocessor accessing instructions to be executed by it from the storage medium layer via the control module; and
    at least one input/output (I/O) device electrically coupled with the control module, the I/O device accessing digital data from the storage medium layer via the control module.

2. An addressable digital data access computer system of claim 1, wherein the control module further includes a connection interface that is electrically coupled to the control subcircuit and the electromagnetic induction subcircuit.

3. An addressable digital data access computer system of claim 2, wherein the connection interface includes a switch subcircuit having a plurality of access address switches, each of which controls the access to a region corresponding to one of the access addresses.

4. An addressable digital data access computer system of claim 1, wherein the plurality of coils access the storage medium layer by electromagnetic induction.

5. An addressable digital data access computer system of claim 1, wherein the at least one storage medium layer further includes a conductive material for enhancing electromagnetic induction.

6. An addressable digital data access computer system of claim 1, further comprising a North Bridge electrically coupled to the control module, and the North Bridge accessing digital data from the storage medium layer via the control module.

7. An addressable digital data access computer system of claim 1, wherein the plurality of magnetizable rods are arranged on the surface of the storage medium layer.

8. An addressable digital data access computer system of claim 7, where each of the rods is partially wound around one end of a rod, while the other end of the rod facing toward the storage medium layer.

9. An addressable digital data access computer system of claim 8, wherein the rods are arranged one opposite to another on two sides of the storage medium layer.

10. An addressable digital data access computer system of claim 1, wherein the microprocessor uses the addressable digital data access subsystem as a L2 cache of the microprocessor.

11. An addressable digital data access computer system, comprising:
    an addressable digital data access subsystem, comprising
        a control module including at least one control subcircuit, wherein the control subcircuit has at least one access address table for storing a plurality of access addresses; and
        an access module including at least one storage medium layer and an electromagnetic induction subcircuit, wherein the electromagnetic induction subcircuit has a plurality of coils and a plurality of magnetizable first rods, each first rod being partially wound by a coil and corresponding to one of a plurality of regions in the storage medium layer, the control module controlling the plurality of coils through the access module according to the access address table, in order to access digital data stored in the plurality of regions, wherein each region corresponds to one of the plurality of access addresses in the access address table;
    a microprocessor electrically coupled with the control module, the microprocessor accessing instructions to be executed by it from the storage medium layer via the control module;
    an interface subsystem electrically coupled with the addressable digital data access subsystem, the interface subsystem accessing digital data from the storage medium layer via the control module; and
    at least one input/output (I/O) device electrically coupled with the control module, the I/O device accessing digital data via the interface subsystem.

12. An addressable digital data access computer system of claim 11, wherein the microprocessor is electrically coupled with the interface subsystem.

13. An addressable digital data access computer system of claim 11, wherein the addressable digital data access subsystem further includes a pin module having a plurality of second rods, wherein the microprocessor is electrically coupled with the interface subsystem via the pin module.

14. An addressable digital data access computer system of claim 13, wherein the microprocessor has a plurality of pins, each of which being electrically coupled to at least one second rod.

15. An addressable digital data access computer system of claim 13, wherein the plurality of second rods are arranged between the plurality of first rods.

16. An addressable digital data access computer system of claim 13, further comprising a North Bridge electrically coupled to the control module, and the North Bridge accessing digital data from the storage medium layer via the control module.

17. An addressable digital data access computer system of claim 16, wherein the North Bridge is electrically coupled to the interface subsystem via the pin module, wherein the North Bridge has a plurality of pins, each of which being electrically coupled to at least one second rod.

18. An addressable digital data access computer system of claim 11, wherein the control module further includes a connection interface that is electrically coupled to the control subcircuit and the electromagnetic induction subcircuit.

19. An addressable digital data access computer system of claim 18, wherein the connection interface includes a switch subcircuit having a plurality of access address switches, each of which controls the access to a region corresponding to one of the access addresses.

20. An addressable digital data access computer system of claim 11, wherein the plurality of coils access the storage medium layer by electromagnetic induction.

21. An addressable digital data access computer system of claim 11, wherein the at least one storage medium layer further includes a conductive material for enhancing electromagnetic induction.

22. An addressable digital data access computer system of claim 11, wherein the plurality of magnetizable first rods are arranged on the surface of the storage medium layer.

23. An addressable digital data access computer system of claim 22, where each of the first rods is partially wound around one end of a rod, while the other end of the first rod facing toward the storage medium layer.

24. An addressable digital data access computer system of claim 23, wherein the first rods are arranged one opposite to another on two sides of the storage medium layer.

25. An addressable digital data access computer system of claim 11, wherein the microprocessor uses the addressable digital data access subsystem as a L2 cache of the microprocessor.

* * * * *